(12) United States Patent
Okabe et al.

(10) Patent No.: US 12,089,463 B2
(45) Date of Patent: Sep. 10, 2024

(54) DISPLAY DEVICE

(71) Applicant: Sharp Kabushiki Kaisha, Sakai (JP)

(72) Inventors: Tohru Okabe, Sakai (JP); Shinsuke Saida, Sakai (JP); Shinji Ichikawa, Sakai (JP); Ryosuke Gunji, Sakai (JP); Akira Inoue, Yonago (JP); Yoshihiro Nakada, Yonago (JP); Hiroharu Jinmura, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 404 days.

(21) Appl. No.: 17/761,611

(22) PCT Filed: Sep. 19, 2019

(86) PCT No.: PCT/JP2019/036783
§ 371 (c)(1),
(2) Date: Mar. 18, 2022

(87) PCT Pub. No.: WO2021/053792
PCT Pub. Date: Mar. 25, 2021

(65) Prior Publication Data
US 2022/0376032 A1    Nov. 24, 2022

(51) Int. Cl.
*H10K 59/131*    (2023.01)
*H10K 50/844*    (2023.01)
*H10K 59/121*    (2023.01)
*H10K 59/122*    (2023.01)
*H10K 59/124*    (2023.01)
*H10K 71/00*    (2023.01)
*H10K 59/12*    (2023.01)

(52) U.S. Cl.
CPC ....... *H10K 59/1315* (2023.02); *H10K 50/844* (2023.02); *H10K 59/1216* (2023.02); *H10K 59/122* (2023.02); *H10K 59/124* (2023.02); *H10K 71/00* (2023.02); *H10K 59/1201* (2023.02)

(58) Field of Classification Search
CPC .................................................. H10K 59/1315
See application file for complete search history.

(56) References Cited

U.S. PATENT DOCUMENTS

| 10,170,534 B1 * | 1/2019 | Kim ..................... H01L 27/124 |
| 2015/0062195 A1 | 3/2015 | Kumeta et al. |
| 2015/0070616 A1 * | 3/2015 | Ogasawara .......... H10K 59/131 |
| | | 349/43 |
| 2017/0323936 A1 * | 11/2017 | Lee .................... H10K 59/1216 |
| 2018/0061897 A1 * | 3/2018 | Oh ......................... G06F 3/0443 |
| 2018/0061899 A1 * | 3/2018 | Oh ..................... H10K 59/8722 |

(Continued)

FOREIGN PATENT DOCUMENTS

JP    2015-049335 A    3/2015

*Primary Examiner* — Grant S Withers
(74) *Attorney, Agent, or Firm* — Keating & Bennett, LLP (57) ABSTRACT

A display device according to an aspect of the disclosure includes a first metal protrusion being in contact with a first power-source trunk wire, and a second metal protrusion being in contact with a second power-source trunk wire. A first bank defining the end of an organic sealing film includes the first metal protrusion, the second metal protrusion, and a first resin protrusion. The first resin protrusion overlaps the first and second metal protrusions. The first resin protrusion has a frame shape.

12 Claims, 7 Drawing Sheets

(56) References Cited

U.S. PATENT DOCUMENTS

| | | | | |
|---|---|---|---|---|
| 2018/0197484 A1* | 7/2018 | Moon | ................... | H01L 27/12 |
| 2019/0148469 A1* | 5/2019 | Lhee | ................... | H10K 50/844 |
| | | | | 257/40 |
| 2019/0165084 A1* | 5/2019 | Park | ................... | H10K 59/8722 |
| 2019/0305072 A1* | 10/2019 | Park | ................... | G09G 3/3233 |
| 2020/0295310 A1* | 9/2020 | Moon | ................ | H10K 59/1315 |
| 2020/0381653 A1* | 12/2020 | Bang | ................... | H10K 50/844 |
| 2021/0408462 A1* | 12/2021 | Tang | ................... | H10K 59/873 |
| 2022/0310773 A1* | 9/2022 | You | ................... | H10K 59/131 |

\* cited by examiner

DISPLAY DEVICE

TECHNICAL FIELD

The disclosure relates to a display device.

BACKGROUND ART

Patent Literature 1 discloses supplying two kinds of power source voltage (ELVDD and EELVSS) to pixel circuits each of which includes a drive transistor, a capacitor, and a light emitter (e.g., an organic light-emitting diode).

CITATION LIST

Patent Literature

Patent Literature 1: Japanese Unexamined Patent Application Publication No. 2015-49335

SUMMARY

Technical Problem

If the two kinds of power source voltage are unstable, the brightness of the light emitters cannot be regulated with high accuracy unfortunately.

Solution to Problem

A display device according to one aspect of the disclosure includes the following: a display region including a plurality of pixel circuits; a frame region; and a terminal section. A first bank having a frame shape is provided so as to surround the display region. A thin-film transistor layer, a light emitter layer, and a sealing layer are disposed over a substrate. The thin-film transistor layer includes a first metal layer, a first interlayer insulating film, a second metal layer, a second interlayer insulating film, a third metal layer, a first flattening film, a fourth metal layer, and a second flattening film. The light emitter layer includes a first electrode, an edge cover film, a light-emitting layer, and a second electrode. The sealing layer includes a first inorganic sealing film, an organic sealing film, and a second inorganic sealing film. Each of the plurality of pixel circuits includes a light emitter, a drive transistor, and a capacitor. The display region includes a scan signal line, a data signal line, and a power-source voltage line electrically connected to an electrode of the capacitor. The organic sealing film has an end defined by the first bank. A first slit in which the first and second flattening films and the edge cover film are removed is disposed between the display region and the first bank. The third metal layer includes the following: a first power-source trunk wire electrically connected to the power-source voltage line; and a second power-source trunk wire electrically connected to the second electrode via a conductive film disposed in a layer identical to a layer where the first electrode is disposed. The fourth metal layer includes the following: a first metal protrusion being in contact with the first power-source trunk wire; and a second metal protrusion being in contact with the second power-source trunk wire. The first and second power-source trunk wires overlap the first slit. The first bank includes the following: the first metal protrusion; the second metal protrusion; and a first resin protrusion overlapping the first and second metal protrusions. The first resin protrusion is disposed in a higher layer than the first electrode. The first resin protrusion has a frame shape.

Advantageous Effect of Disclosure

Providing the first metal protrusion being in contact with the first power-source trunk wire, and the second metal protrusion being in contact with the second power-source trunk wire stables the first power source voltage, supplied from the first power-source trunk wire, and the second power source voltage, supplied from the second power-source trunk wire, thereby regulating the brightness of the light emitters with high accuracy.

DESCRIPTION OF EMBODIMENTS

First Embodiment

Figure 1:
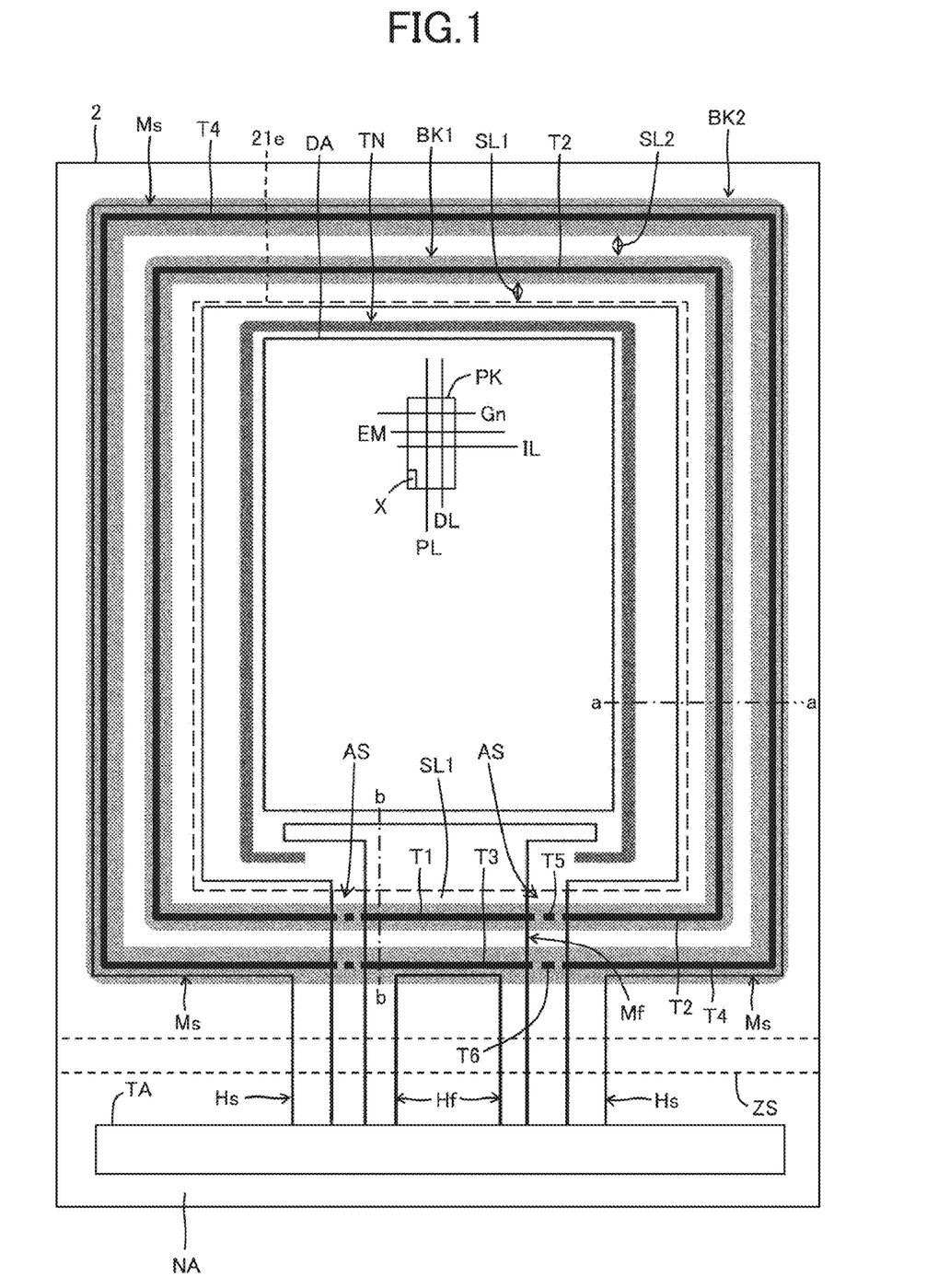
FIG. 1 is a plan view of the configuration of a display device according to a first embodiment.

FIG. 1 is a plan view of the configuration of a display device according to a first embodiment. FIG. 2(a) is a sectional view taken along line a-a in FIG. 1. FIG. 2(b) is a sectional view taken along line b-b in FIG. 1.

Figure 2:
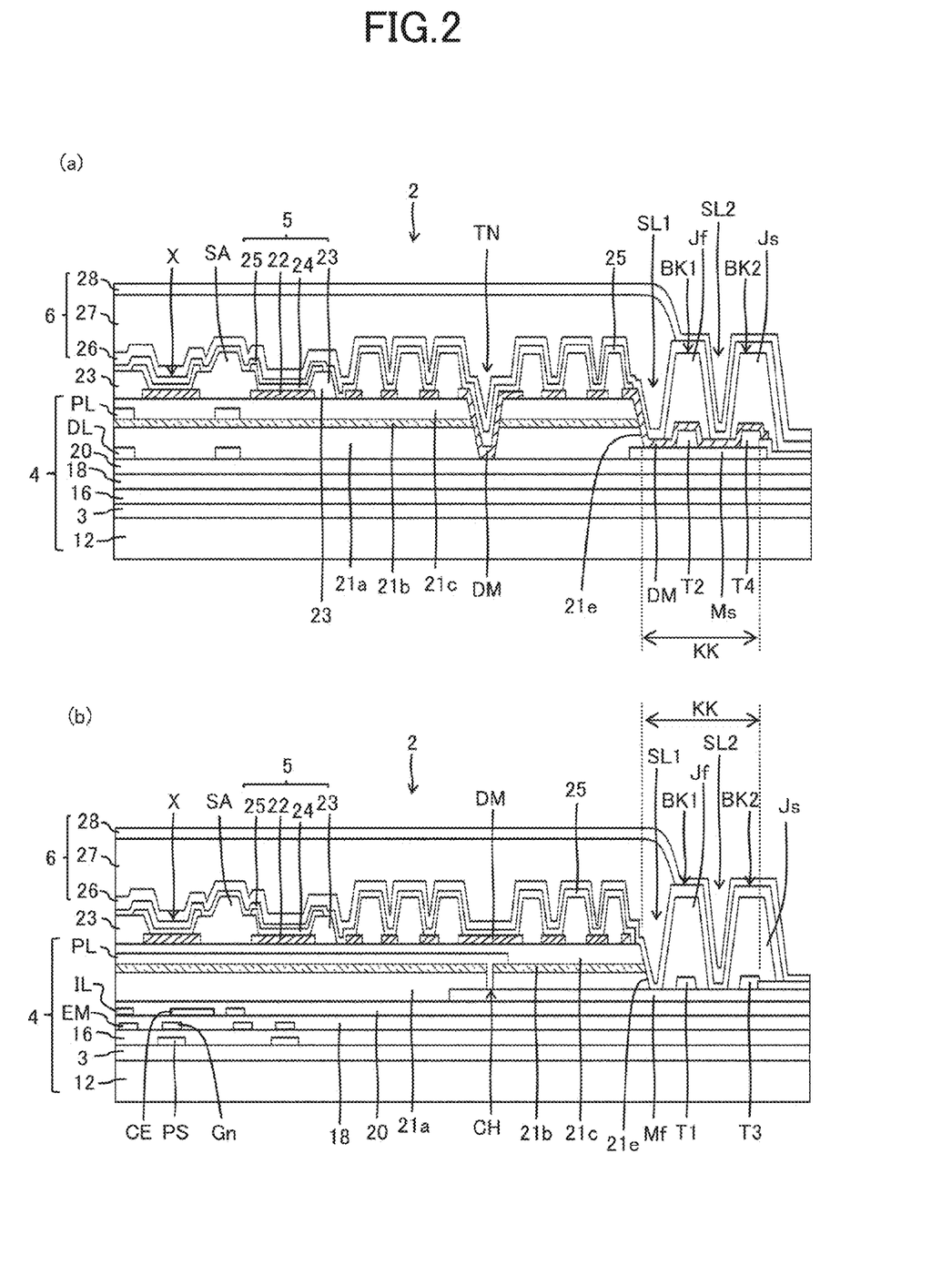
FIG. 2(a) is a sectional view taken along line a-a in FIG. 1.
FIG. 2(b) is a sectional view taken along line b-b in FIG. 1.

FIGS. 1 and 2 show a display device 2. The display device 2 has a substrate 12, on which a barrier layer 3, a thin-film transistor layer 4, a top-emission light emitter layer 5 (designed to emit light upward), and a sealing layer 6 are stacked in this order. The display device 2 also has a display region DA, which includes a plurality of pixel circuits PK having a self-emission light emitter X. The display region DA is surrounded by a frame region NA, which includes a terminal section TA.

The substrate 12 is a glass substrate, or a flexible substrate mainly made of resin, such as polyimide. The substrate 12 can be also composed of, for instance, two polyimide films and an inorganic film interposed between these polyimide films. The barrier layer (base coat layer) 3 is an inorganic insulating film that prevents intrusion of foreign substances, such as water and oxygen. The barrier layer 3 can be made of, for instance, silicon nitride or silicon oxide.

As illustrated in FIG. 2, the thin-film transistor layer 4 includes the following: a semiconductor layer PS in a higher layer than the barrier layer 3; a gate insulating film 16 in a higher layer than the semiconductor layer PC; a first metal layer (including a scan signal line Gn) in a higher layer than the gate insulating film 16; a first interlayer insulating film 18 in a higher layer than the first metal layer; a second metal layer (including an initialization voltage line IL) in a higher layer than the first interlayer insulating film 18; a second interlayer insulating film 20 in a higher layer than the second metal layer; a third metal layer (including a data signal line DL) in a higher layer than the second interlayer insulating film 20; a first flattening film 21a in a higher layer than the third metal layer; a third interlayer insulating film 21b in a higher layer than the first flattening film 21a; a fourth metal layer (including a power-source voltage line PL) in a higher layer than the third interlayer insulating film 21b; and a second flattening film 21c in a higher layer than the fourth metal layer.

The semiconductor layer PS is made of, for instance, low-temperature polysilicon (LTPS) and constitutes, together with gate electrodes in the same layer as the scan signal line Gn, various transistors. The semiconductor layer PS may be processed into a conductor in a region except the transistor's channel region.

The first, second, third, and fourth metal layers are composed of a monolayer film of metal including at least one of, for instance, aluminum, tungsten, molybdenum, tantalum, chromium, titanium, and copper; alternatively these layers are composed of a laminated film of these materials.

The gate insulating film 16, the first interlayer insulating film 18, the second interlayer insulating film 20, and the third interlayer insulating film 21b can be composed of a silicon oxide (SiOx) film or a silicon nitride (SiNx) film, both of which are formed through CVD, or can be composed of a laminate of these films. The first flattening film 21a and the second flattening film 21c can be made of an organic material that can be applied, such as polyimide or acrylic resin.

The light emitter layer 5 includes the following: a first electrode (lower electrode) 22 in a higher layer than the flattening film 21; an insulating edge cover film 23 covering the edge of the first electrode 22; an electroluminescence (EL) layer 24 in a higher layer than the edge cover film 23; and a second electrode (upper electrode) 25 in a higher layer than the EL layer 24. The edge cover film 23 is formed by, for instance, applying an organic material, such as polyimide or acrylic resin, followed by patterning through photolithography.

The light emitter layer 5 includes, for instance, a plurality of light emitters X that emit different colors of light. Each light emitter includes the first electrode 22 in the form of an island, the EL layer 24 (including a light-emitting layer), and the second electrode 25. The second electrode 25 is a common flat electrode shared among the plurality of light emitters.

Each light emitter X may be, for instance, an organic light-emitting diode (OLED) including a light-emitting layer, which is herein an organic layer, or may be, for instance, a quantum-dot light-emitting diode (QLED) including a light-emitting layer, which is herein a quantum-dot layer.

The EL layer 24 is composed of, for instance, the following layers sequentially stacked from below: a hole injection layer, a hole transport layer, a light-emitting layer, an electron transport layer, and an electron injection layer. The light-emitting layer is provided in the form of islands in the openings of the edge cover film 23 (i.e., for each light emitter) through evaporation, an ink-jet method, or photolithography. The other layers are provided in the form of islands or in a flat manner (common layer). One or more of the hole injection layer, hole transport layer, electron transport layer and electron injection layer can be omitted.

The first electrode 22 (anode) is a light-reflective electrode having, for instance, a stack of indium tin oxide (ITO) and silver (Ag) or a stack of ITO and Ag-containing alloy. The second electrode 25 (cathode) is composed of a metal thin film made of, for instance, magnesium silver alloy and has light transparency.

When each light emitter X is an OLED, a drive current between the first electrode 22 and second electrode 25 rejoins holes and electrons within the light-emitting layer, EK, thus generating excitons. These excitons emit light in the process of transition to a ground state. When each light emitter X is a QLED, a drive current between the first electrode 22 and second electrode 25 rejoins holes and electrons within the light-emitting layer EK, thus generating excitons. These excitons emit light in the process of transition from a conduction band level of the quantum dots to a valence band level of the quantum dots.

In FIG. 2(b), the sealing layer 6 covering the light emitter layer 5 prevents foreign substances, such as water and oxygen, from intruding into the light emitter layer 5, and the sealing layer 6 can be composed of a first inorganic sealing film 26, a second inorganic sealing film 28, and an organic sealing film 27, which is interposed therebetween.

Figure 3:
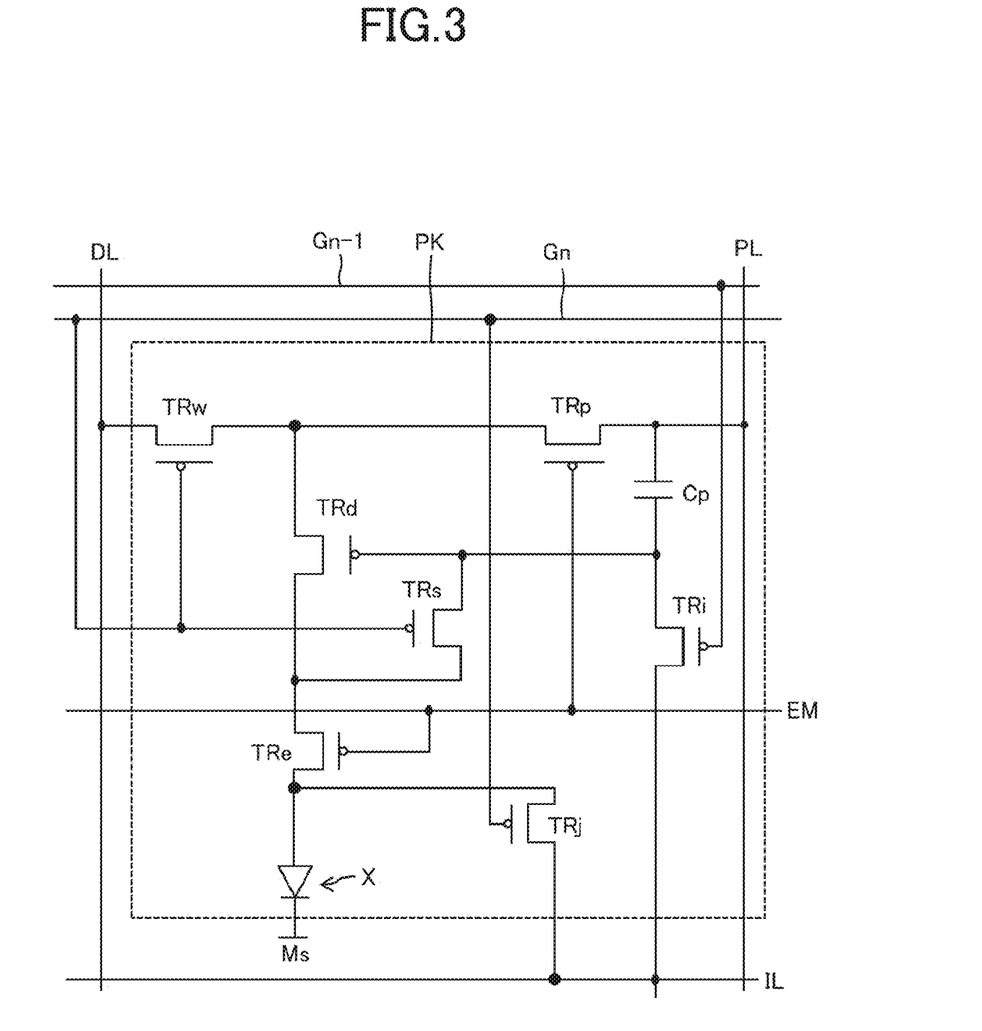
FIG. 3 is a circuit diagram of a pixel circuit according to the first embodiment.

FIG. 3 is a circuit diagram illustrating an example pixel circuit. The illustrated pixel circuit is a mere example. Other various configurations can be used.

The pixel circuit in FIG. 3 includes the following: the light emitter X; a capacitor Cp; a first initialization transistor TRi having a gate terminal connected to a scan signal line Gn−1, which is in the anterior stage (n−1 stage); a threshold control transistor TRs having a gate terminal connected to the scan signal line Gn, which is in the target stage (n stage); a write control transistor TRw having a gate terminal connected to the scan signal line Gn, which is in the target stage (n stage); a drive transistor TRd that regulates current flowing through the light emitter X; a power supply transistor TRp having a gate terminal connected to a light-emission control line EM (in the n stage); a light-emission control transistor TRe having a gate terminal connected to the light-emission control line EM (in the n stage); and a second initialization transistor TRj having a gate terminal connected to the scan signal line Gn, which is in the target stage (n stage).

The drive transistor TRd has a gate terminal connected to the power-source voltage line PL via the capacitor Cp and connected to the initialization voltage line IL via the first initialization transistor TRi. The drive transistor TRd has a source terminal connected to the data signal line DL via the write control transistor TRw and connected to the power-source voltage line PL via the power supply transistor TRp. The drive transistor TRd has a drain terminal connected to the anode of the light emitter X via the light-emission control transistor TRe and connected to the gate terminal of the drive transistor TRd via the threshold control transistor TRs. The anode of the light emitter X is connected to the initialization voltage line IL via the second initialization transistor TRj. For instance, the power-source voltage line PL is supplied with a first power source voltage (ELVDD), which is a high voltage, and the cathode of the light emitter X is supplied with a second power source voltage (ELVSS), which is a low voltage.

The frame region NA includes the following: the terminal section TA facing one of the sides of the display region DA; a bank BK1 having a frame shape surrounding the display region DA; and a bank BK2 having a frame shape surrounding the bank BK1. The first bank BK1 functions as, for instance, a liquid blocker that operates when the organic sealing film 27 is applied through an ink-jet method, and the first bank BK1 defines the end (edge) of the organic sealing film 27.

Disposed between the display region DA and bank BK1 is a trench TN, where the first flattening film 21a, the third interlayer insulating film 21b, the second flattening film 21c, and the edge cover film 23 are removed. The trench TN extends along three of the sides of the display region DA and along both ends of the remaining side (i.e., the side facing the terminal section TA) thereof. Disposed between the terminal section TA and second bank BK2 is a bending section ZS. The bending section ZS enables the terminal section TA to be bent toward the backside (lower surface).

Disposed between the terminal section TA and display region DA is a first power-source trunk wire Mf overlapping the first bank BK1 and second bank BK2 and passing through the gap of the trench TN. The first power-source trunk wire Mf is included in the third metal layer together with the data signal line DL and is connected to the terminal section TA via two muted wires Hf. The first power-source trunk wire Mf is supplied with the first power source voltage (ELVDD) via the terminal section TA, and a plurality of power-source voltage lines PL are each electrically connected to the first power-source trunk wire Mf.

Disposed outside the trench TN is a second power-source trunk wire Ms overlapping the first bank BK1 and second bank BK2 and extending along the trench TN. The second power-source trunk wire Ms is included in the third metal layer together with the data signal line DL and is connected to the terminal section TA via two routed wires Hs. The second power-source trunk wire Ms is supplied with the second power source voltage (ELVSS) via the terminal section TA, and the second electrode (cathode) 25 of the light emitters X is electrically connected to the second power-source trunk wire Ms.

In the display region DA, a plurality of scan signal lines Gn, a plurality of light-emission control lines EM, and a plurality of initialization voltage lines IL extend in a row direction, and a plurality of power-source voltage lines PL and a plurality of data signal lines DL extend in a column direction. The plurality of power-source voltage lines PL may be provided in the form of a lattice extending in the row and column directions. In the frame region NA, the bending section ZS extends in the row direction, and the two routed wires Hf and the two routed wires Hs extend in the column direction. Herein, the two routed wires Hf are disposed between the two routed wires Hs. The plurality of pixel circuits PK are arranged in matrix so as to correspond to each intersection between the scan signal line Gn and data signal line DL.

As illustrated in FIGS. 1 and 2, the display device 2 has a first slit SL1 disposed between the display region DA and first bank BK1, with the first flattening film 21a, third interlayer insulating film 21b, second flattening film 21c and edge cover film 23 removed from the first slit SL1. In addition, the first power-source trunk wire Mf and the second power-source trunk wire Ms overlap the first slit SL1.

The display device 2 also has a second slit SL2 disposed between the first bank BK1 and second bank BK2, with the first flattening film 21a, third interlayer insulating film 21b, second flattening film 21c and edge cover film 23 removed from the second slit SL2. In addition, the first power-source trunk wire Mf and the second power-source trunk wire Ms overlap the second slit SL2.

The first electrode 22 is included in a first electrode layer. The first electrode layer includes a conductive film DM overlapping the trench TN, first slit SL1, first bank BK1 and second bank BK2. The conductive film DM is in contact with the second electrode 25 within the trench TN and is in contact with the second power-source trunk wire Ms within the first slit SL1. FIG. 2 illustrates that the conductive film DM and the second power-source trunk wire Ms are in contact with each other at a portion where the first slit SL1 and an opening KK of the third interlayer insulating film 21b overlap each other. The power-source voltage line PL is in contact with the first power-source trunk wire Mf within a contact hole CH, which penetrates the first flattening film 21a and third interlayer insulating film 21b.

The power-source voltage line PL is included in the fourth metal layer. The fourth metal layer includes the following: a first metal protrusion T1 and a third metal protrusion T3 both being in contact with the first power-source trunk wire Mf; and a second metal protrusion T2 and a fourth metal protrusion T4 both being in contact with the second power-source trunk wire Ms.

The first metal protrusion T1 and the third metal protrusion T3 are linear protrusions disposed between the terminal section TA and display region DA. The second metal protrusion T2 and fourth metal protrusion T4 are frame-shaped protrusions facing the terminal section TA and extending along a part of one of the sides of the display region DA and along the remaining three sides of the display region DA. In FIG. 2, the first power-source trunk wire Mf is in contact with the first metal protrusion T1 and third metal protrusion T3 under the opening KK of the third interlayer insulating film 21b, and the second power-source trunk wire Ms is in contact with the second metal protrusion T2 and fourth metal protrusion T4 under the opening KK.

The first bank BK1 includes the first metal protrusion T1 and the second metal protrusion T2. The first bank BK1 also includes a first resin protrusion Jf having a frame shape and disposed in a higher layer than the first electrode 22 (in FIG. 2, in the same layer as the edge cover film 23) so as to overlap the first metal protrusion T1 and second metal protrusion T2. The first bank BK1 also includes an island-shaped metal protrusion T5 disposed between the first metal protrusion T1 and second metal protrusion T2 and disposed in the same layer (fourth metal layer) as these protrusions.

The second bank BK2 includes the third metal protrusion T3 and the fourth metal protrusion T4. The second bank BK2 also includes a second resin protrusion Js having a frame shape and disposed in a higher layer than the first electrode 22 (in FIG. 2, in the same layer as the edge cover film 23) so as to overlap the third metal protrusion T3 and fourth metal protrusion T4. The second bank BK2 also includes an island-shaped metal protrusion T6 disposed between the third metal protrusion T3 and fourth metal protrusion T4 and disposed in the same layer (fourth metal layer) as these protrusions.

Providing the island-shaped metal protrusion T5 enables the first bank BK1 to have a sufficient thickness. The island-shaped metal protrusion T5 is electrically insulated from the first metal protrusion T1 and second metal protrusion T2. The island-shaped metal protrusion T5 and the second metal protrusion T2 are unlikely to be brought into electrical connection even if, for instance, the first metal protrusion T1 and the island-shaped metal protrusion T5 are brought into electrical connection by variations in process step. That is, the first metal protrusion T1 and the second metal protrusion T2 are unlikely to involve electrical leakage, thus enhancing yield.

Providing the island-shaped metal protrusion T6 enables the second bank BK2 to have a sufficient thickness. The island-shaped metal protrusion T6 is electrically insulated from the third metal protrusion T3 and fourth metal protrusion T4. Here, the island-shaped metal protrusion T6 and the fourth metal protrusion T4 are unlikely to be brought into electrical connection even if, for instance, the third metal protrusion T3 and the island-shaped metal protrusion T6 are brought into electrical connection by variations in process step. That is, the third metal protrusion T3 and the fourth metal protrusion T4 are unlikely to involve electrical leakage, thus enhancing yield.

Providing the first metal protrusion T1 through the fourth metal protrusion T4 in this way can reduce the resistances of the first power-source trunk wire Mf and second power-source trunk wire Ms, thereby stabling the first power source voltage (ELVDD), supplied from the first power-source trunk wire Mf to the power-source voltage line PL, and the second power source voltage (ELVSS), supplied from the second power-source trunk wire Ms to the second electrode 25. This can regulate the brightness of the light emitters X with high accuracy.

The foregoing configuration enables the first bank BK1 to have a lower height than a configuration where the second flattening film 21c (organic film) remains under the first resin protrusion Jf. This can avoid both of the first power-source trunk wire Mf and second power-source trunk wire Ms from a short circuit, which tends to occur in the first slit SL1 at an adjacent portion AS, which is a region where the first power-source trunk wire Mf and the second power-source trunk wire Ms are adjacent to each other. If the first bank BK1 is too tall, the conductive film DM remains in some cases without being etched at the adjacent portion AS, thus causing a short circuit in the first power-source trunk wire Mf and second power-source trunk wire Ms.

It is noted that the fourth metal layer (including the power-source voltage line PL, the first metal protrusion T1 through the fourth metal protrusion T4, and the island-shaped metal protrusions T5 and T6) is 1 μm thick for instance. It is also noted that the first bank BK1 is 3.5 μm thick (high) for instance. It is also noted that the second bank BK2 is 4 μm thick (high) for instance. It is also noted that the third metal layer (including the data signal line DL, the first power-source trunk wire Mf, and the second power-source trunk wire Ms) is 1 μm thick for instance. It is also noted that each of the first flattening film 21a and second flattening film 21c is 1.5 μm thick for instance.

A photo-spacer SA functions as a surface with which an FMM are in contact during evaporation of a light-emitting layer, and like the first resin protrusion Jf and the second resin protrusion Js, the photo-spacer SA can be formed in the same layer as the edge cover film 23.

The island-shaped metal protrusion T5 does not have to be provided when the gap between the first metal protrusion T1 and second metal protrusion T2 is small; moreover, the island-shaped metal protrusion T6 does not have to be provided when the gap between the third metal protrusion T3 and fourth metal protrusion T4 is small. This is because that the surface tension of the first resin protrusion Jf and second resin protrusion Js enables the first bank BK1 and second bank BK2 to have a sufficient thickness.

Although the third interlayer insulating film 21b is disposed between the first flattening film 21a and fourth metal layer by way of example only, the third interlayer insulating film 21b may be disposed between the third metal layer and first flattening film 21a.

Figure 4:
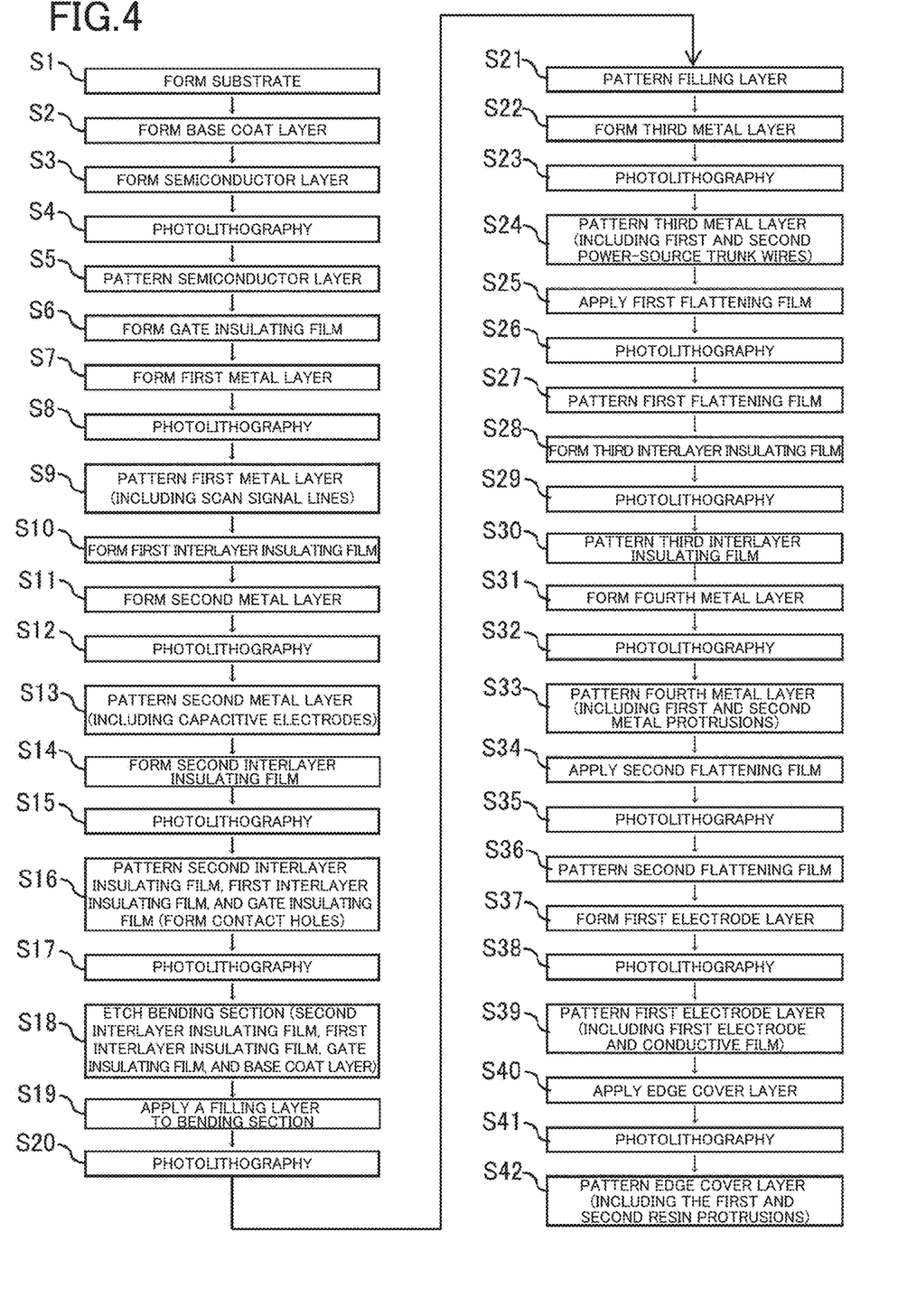
FIG. 4 is a flowchart illustrating a method for manufacturing the display device according to the first embodiment.

FIG. 4 is a flowchart showing a method for manufacturing the display device according to the first embodiment. Step S1 is forming the substrate 12. Step S2 is forming the base coat layer 3. Step S3 is forming the semiconductor layer PS. Step S4 is performing photolithography. Step S5 is patterning the semiconductor layer PS. Step S6 is forming the gate insulating film 16. Step S7 is forming the first metal layer. Step S8 is performing photolithography. Step S9 is patterning the first metal layer (including the scan signal lines Gn, the light-emission control lines EM, and the gate electrodes of the individual transistors). Step S10 is forming the first interlayer insulating film 18. Step S11 is forming the second metal layer. Step S12 is performing photolithography. Step S13 is patterning the second metal layer (including the initialization voltage lines IL, and capacitive electrodes CE, each of which is one of the electrodes of the capacitor). Step S14 is forming the second interlayer insulating film 20. Step S15 is performing photolithography. Step S16 is patterning the second interlayer insulating film 20, the first interlayer insulating film 18, and the gate insulating film 16 (i.e., forming contact holes). Step S17 is performing photolithography. Step S18 is etching the bending section ZS (the second interlayer insulating film 20, the first interlayer insulating film 18, the gate insulating film 16, and the base coat layer 3). Step S19 is applying a filling layer (e.g., polyimide) to the pit of the bending section ZS, which has been formed in Step S18. Step S20 is performing photolithography.

Step S21 is patterning the filling layer. Step S22 is forming the third metal layer. Step S23 is performing photolithography. Step S24 is patterning the third metal layer (including the data signal lines DL, the first power-source trunk wire Mf, and the second power-source trunk wire Ms). Step S25 is applying the first flattening film 21a. Step S26 is performing photolithography. Step S27 is patterning the first flattening film 21a. Step S28 is forming the third interlayer insulating film 21b. Step S29 is performing photolithography. Step S30 is patterning the third interlayer insulating film 21b. Step S31 is forming the fourth metal layer. Step S32 is performing photolithography. Step S33 is patterning the fourth metal layer (including the power-source voltage lines PL, the first metal protrusion T1 through the fourth metal protrusion T4, and the island-shaped metal protrusions T5 and T6). Step S34 is applying the second flattening film 21c. Step S35 is performing photolithography. Step S36 is patterning the second flattening film 21c. Step S37 is forming the first electrode layer. Step S38 is performing photolithography. Step S39 is patterning the first electrode layer (including the first electrode 22 and the conductive film DM). Step S40 is applying an edge cover layer. Step S41 is performing photolithography. Step S42 is patterning the edge cover layer (including the edge cover film 23, the first resin protrusion Jf, and the second resin protrusion Js).

Modification

Figure 5:
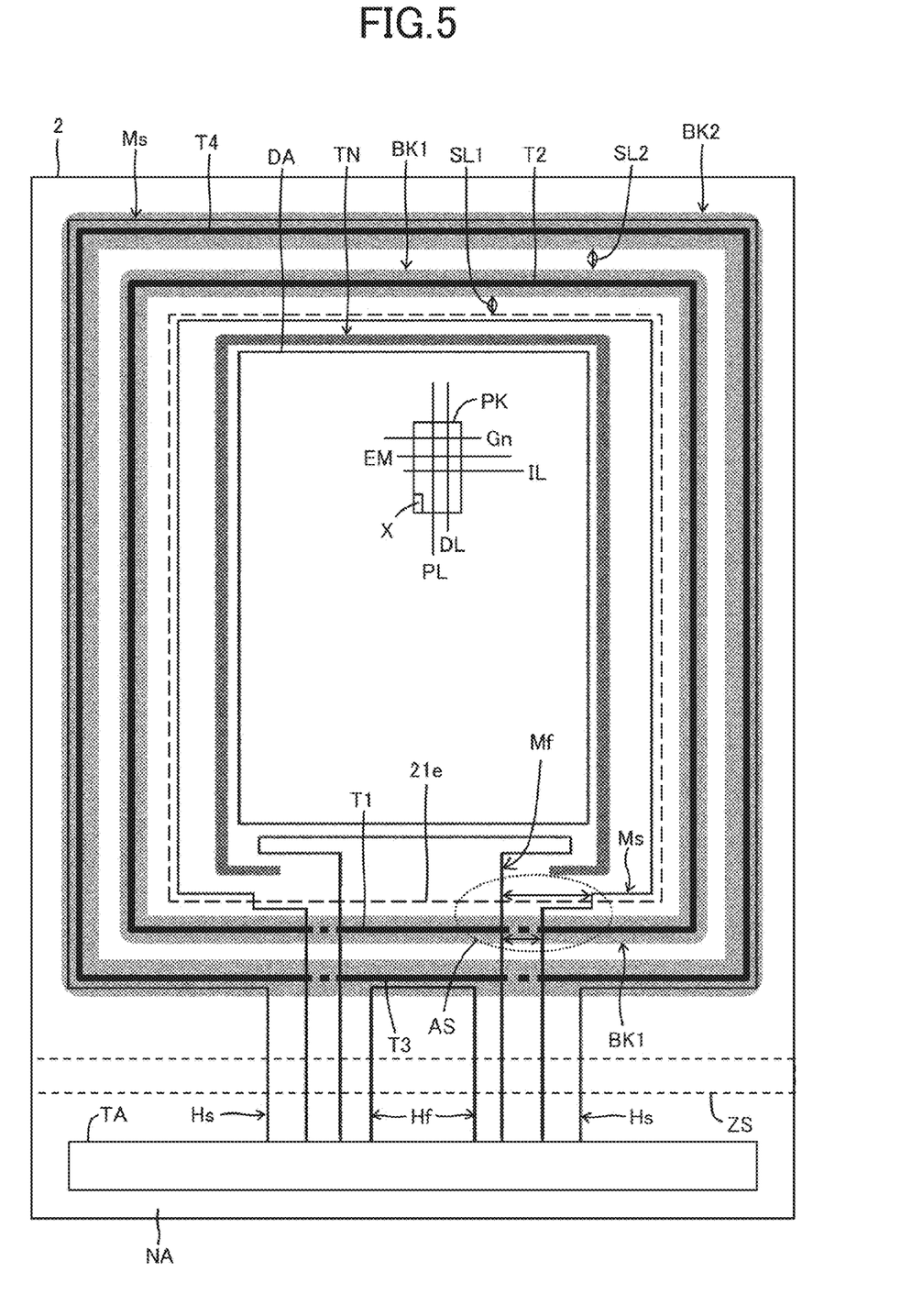
FIG. 5 is a plan view of a modification of the display device according to the first embodiment.

FIG. 5 is a plan view of a modification of the display device according to the first embodiment. FIG. 5 illustrates that in an adjacent region AS, which is a region where the first power-source trunk wire Mf and the second power-source trunk wire Ms are adjacent to each other, the gap between the first power-source trunk wire Mf and second power-source trunk wire Ms under an edge 21e of the first flattening film 21a is wider than the gap between the first power-source trunk wire Mf and second power-source trunk wire Ms under the first bank BK1. That is, the second power-source trunk wire Ms has a cut at an intersection where the second power-source trunk wire Ms meets the first flattening film 21a. In this configuration, the fourth metal layer and film residues of the conductive film DM over the edge 21e of the first flattening film 21a are less likely to be continuous from the first power-source trunk wire Mf to the second power-source trunk wire Ms, thereby preventing the first power-source trunk wire Mf and second power-source trunk wire Ms from a short circuit that is caused by the film residues.

Second Embodiment

Figure 6:
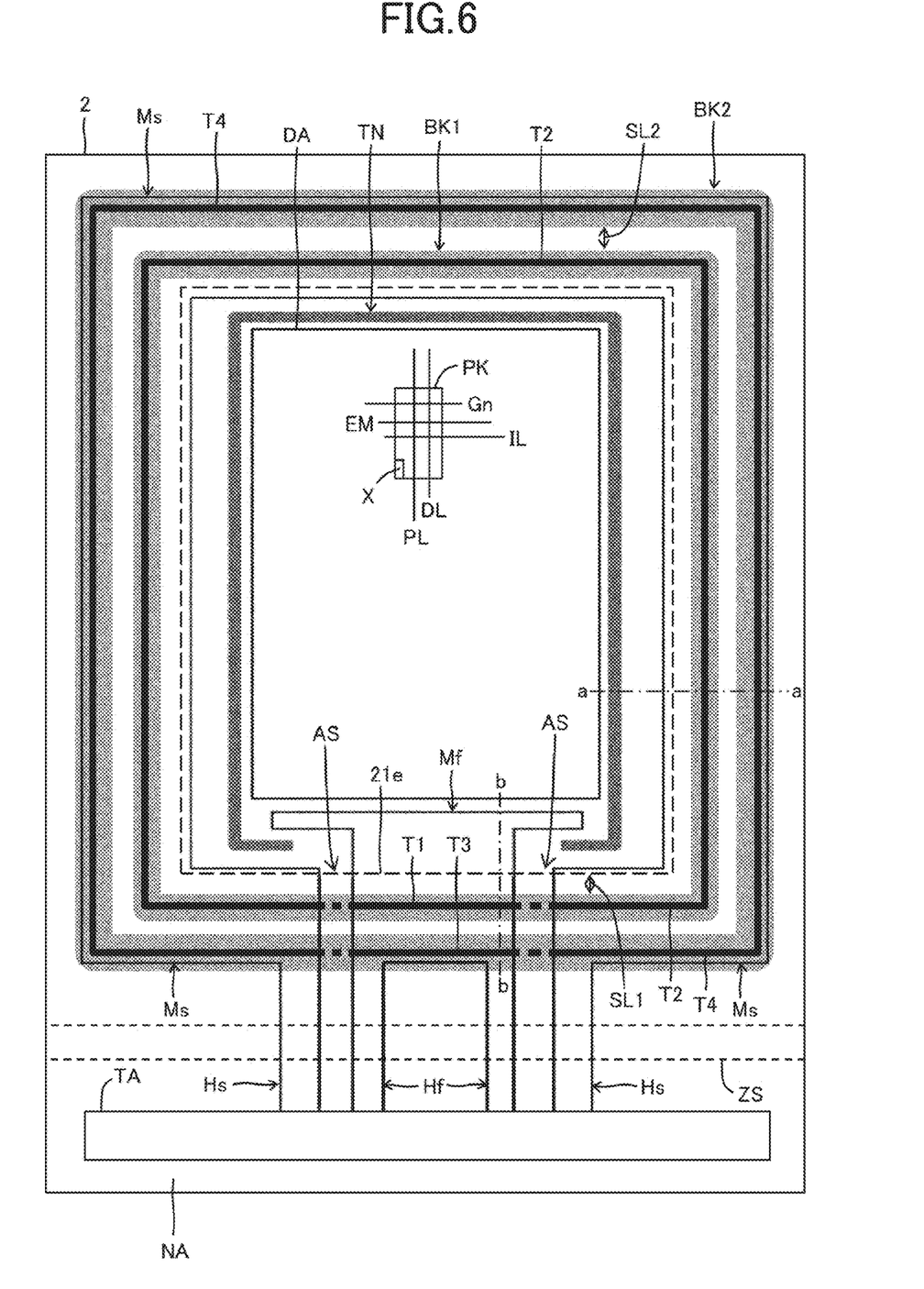
FIG. 6 is a plan view of the configuration of a display device according to a second embodiment.
Figure 7:
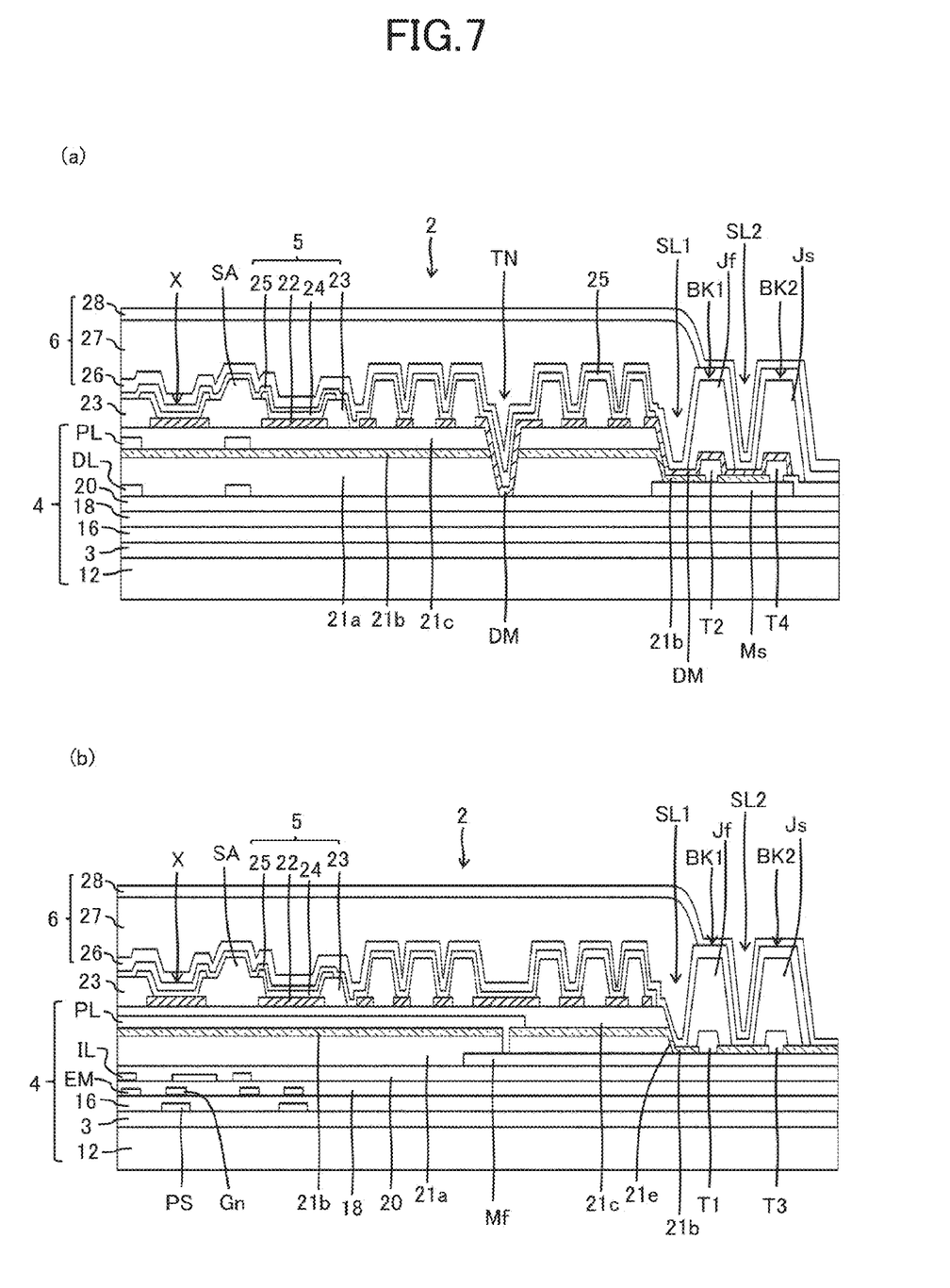
FIG. 7(a) is a sectional view taken along line a-a in FIG. 6.
FIG. 7(b) is a sectional view taken along line b-b in FIG. 6.

FIG. 6 is a plan view of the configuration of a display device according to a second embodiment. FIG. 7(a) is a sectional view taken along line a-a in FIG. 6. FIG. 7(b) is a sectional view taken along line b-b in FIG. 6. FIG. 7(a) illustrates that the second power-source trunk wire Ms in the first slit SL1 is covered with the third interlayer insulating film 21b. FIG. 7(a) also illustrates that the third interlayer insulating film 21b has an opening overlapping at least the first bank BK1, and an opening overlapping at least the second bank BK2. FIG. 7(a) also illustrates that the conductive film DM and the second power-source trunk wire Ms are electrically connected together via the second metal protrusion T2 and fourth metal protrusion T4.

That is, the conductive film DM covers the second metal protrusion T2 and the fourth metal protrusion T4. In addition, the second power-source trunk wire Ms and the second metal protrusion T2 are in contact with each other in the opening of the third interlayer insulating film 21b overlapping the first bank BK1. In addition, the second power-source trunk wire Ms and the fourth metal protrusion T4 are in contact with each other in the opening of the third interlayer insulating film 21b overlapping the second bank BK2. This can reduce the resistance of the second power-source trunk wire Ms.

FIG. 7(b) illustrates that the first power-source trunk wire Mf in the first slit SL1 is covered with the third interlayer insulating film 21b. FIG. 7(b) also illustrates that the third interlayer insulating film 21b has an opening overlapping at least the first bank BK1, and an opening overlapping at least the second bank BK2. FIG. 7(b) also illustrates that the first power-source trunk wire Mf and the first metal protrusion T1 are in contact with each other in the opening of the third interlayer insulating film 21b overlapping the first bank BK1. FIG. 7(b) also illustrates that the first power-source trunk wire Mf and the third metal protrusion T3 are in contact with each other in the opening of the third interlayer insulating film 21b overlapping the second bank BK2. This can reduce the resistance of the first power-source trunk wire Mf.

In the second embodiment, the third interlayer insulating film 21b between the first flattening film 21a and fourth metal layer needs to cover at least the edge 21e of the first flattening film 21a, and to have an opening overlapping at least the first bank BK1 and an opening overlapping at least the second bank BK2.

In the second embodiment, film residues are insulated from the first power-source trunk wire Mf and second power-source trunk wire Ms by the third interlayer insulating film 21b even when such film residues of the conductive film DM remain over the edge 21e of the first flattening film 21a in an adjacent region AS, which is a region where the first power-source trunk wire Mf and the second power-source trunk wire Ms are adjacent to each other. This configuration can avoid the first power-source trunk wire Mf and second power-source trunk wire Ms from a short circuit that is caused by the film residues.

The foregoing embodiments are all illustrative and descriptive and are thus not restrictive. It is obvious for one having ordinary skill in the art that numerous modifications can be devised based on the illustrative and descriptive embodiments.

First Aspect

A display device includes the following: a display region including a plurality of pixel circuits; a frame region; and a terminal section. A first bank having a frame shape is provided so as to surround the display region. A thin-film transistor layer, a light emitter layer, and a sealing layer are disposed over a substrate. The thin-film transistor layer includes a first metal layer, a first interlayer insulating film, a second metal layer, a second interlayer insulating film, a third metal layer, a first flattening film, a fourth metal layer, and a second flattening film. The light emitter layer includes a first electrode, an edge cover film, a light-emitting layer, and a second electrode. The sealing layer includes a first inorganic sealing film, an organic sealing film, and a second inorganic sealing film. Each of the plurality of pixel circuits includes a light emitter, a drive transistor, and a capacitor. The display region includes a scan signal line, a data signal line, and a power-source voltage line electrically connected to an electrode of the capacitor. The organic sealing film has an end defined by the first bank. A first slit in which the first and second flattening films and the edge cover film are removed is disposed between the display region and the first bank. The third metal layer includes the following: a first power-source trunk wire electrically connected to the power-source voltage line; and a second power-source trunk wire electrically connected to the second electrode via a conductive film disposed in a layer identical to a layer where the first electrode is disposed. The fourth metal layer includes the following: a first metal protrusion being in contact with the first power-source trunk wire; and a second metal protrusion being in contact with the second power-source trunk wire. The first and second power-source trunk wires overlap the first slit. The first bank includes the following: the first metal protrusion; the second metal protrusion; and a first resin protrusion overlapping the first and second metal protrusions. The first resin protrusion is disposed in a higher layer than the first electrode. The first resin protrusion has a frame shape.

Second Aspect

In the display device according to, for instance, the first aspect, the first resin protrusion is disposed in a layer identical to a layer where the edge cover film is disposed, and the first resin protrusion is made of a material identical to the material of the edge cover film.

Third Aspect

In the display device according to, for instance, the second aspect, the first metal protrusion is disposed between the terminal section and one of the sides of the display region. The one side faces the terminal section.

Fourth Aspect

In the display device according to, for instance, the third aspect, the second metal protrusion is disposed along a part of the one side of the display region facing the terminal section and along remaining three of the sides of the display region.

Fifth Aspect

In the display device according to, for instance, any one of the first to fourth aspects, the first bank includes an island-shaped metal protrusion between the first and second metal protrusions. The island-shaped metal protrusion is disposed in a layer identical to a layer where the first and second metal protrusions are disposed.

Sixth Aspect

In the display device according to, for instance, any one of the first to fifth aspects, a third interlayer insulating film is disposed between the third and fourth metal layers. In addition, the third interlayer insulating film has an opening under which the first power-source trunk wire and the first metal protrusion are in contact with each other and under which the second power-source trunk wire and the second metal protrusion are in contact with each other.

Seventh Aspect

In the display device according to, for instance, the sixth aspect, the conductive film and the second power-source trunk wire are in contact with each other at a portion where the first slit and the opening of the third interlayer insulating film overlap each other.

Eighth Aspect

In the display device according to, for instance, the seventh aspect, in a region where the first and second power-source trunk wires are adjacent to each other, the gap between the first and second power-source trunk wires under the edge of the first flattening film is wider than the gap between the first and second power-source trunk wires under the first bank.

Ninth Aspect

In the display device according to, for instance, any one of the first to fifth aspects, a third interlayer insulating film is disposed between the first flattening film and the fourth metal layer. In addition, in the first slit, the first and second power-source trunk wires are covered with the third interlayer insulating film.

Tenth Aspect

In the display device according to, for instance, the ninth aspect, the conductive film and the second power-source trunk wire are electrically connected together via the second metal protrusion.

Eleventh Aspect

In the display device according to, for instance, any one of the first to tenth aspects, the scan signal line is included in the first metal layer. In addition, a capacitive electrode serving as an electrode of the capacitor is included in the second metal layer. In addition, the data signal line is included in the third metal layer. In addition, the power-source voltage line is included in the fourth metal layer.

Twelfth Aspect

In the display device according to, for instance, any one of the first to eleventh aspects, a second bank having a frame shape is provided so as to surround the first bank. In addition, a second slit in which the first and second flattening films and the edge cover film are removed is disposed between the first and second banks. In addition, the first and second power-source trunk wires overlap the second slit. In addition the fourth metal layer includes the following: a third metal protrusion being in contact with the first power-source trunk wire; and a fourth metal protrusion being in contact with the second power-source trunk wire. In addition, the second bank includes the following: the third metal protrusion; the fourth metal protrusion; and a second resin protrusion overlapping the third and fourth metal protrusions. The second resin protrusion is disposed in a higher layer than the first electrode. The second resin protrusion has a frame shape.

The invention claimed is:
1. A display device comprising:
a display region including a plurality of pixel circuits;
a frame region; and
a terminal section, wherein
a first bank having a frame shape is provided so as to surround the display region,
a thin-film transistor layer, a light emitter layer, and a sealing layer are disposed over a substrate,
the thin-film transistor layer includes a first metal layer, a first interlayer insulating film, a second metal layer, a second interlayer insulating film, a third metal layer, a first flattening film, a fourth metal layer, and a second flattening film,
the light emitter layer includes a first electrode, an edge cover film, a light-emitting layer, and a second electrode,
the sealing layer includes a first inorganic sealing film, an organic sealing film, and a second inorganic sealing film,
each of the plurality of pixel circuits includes a light emitter, a drive transistor, and a capacitor,
the display region includes a scan signal line, a data signal line, and a power-source voltage line electrically connected to an electrode of the capacitor,
the organic sealing film has an end defined by the first bank,
a first slit in which the first and second flattening films and the edge cover film are removed is disposed between the display region and the first bank,
the third metal layer includes
a first power-source trunk wire electrically connected to the power-source voltage line, and
a second power-source trunk wire electrically connected to the second electrode via a conductive film disposed in a layer identical to a layer where the first electrode is disposed,
the fourth metal layer includes
a first metal protrusion being in contact with the first power-source trunk wire, and
a second metal protrusion being in contact with the second power-source trunk wire,
the first and second power-source trunk wires overlap the first slit, and the first bank includes
the first metal protrusion,
the second metal protrusion, and
a first resin protrusion overlapping the first and second metal protrusions, the first resin protrusion being disposed in a higher layer than the first electrode, the first resin protrusion having a frame shape.

2. The display device according to claim 1, wherein
the first resin protrusion is disposed in a layer identical to a layer where the edge cover film is disposed, and
the first resin protrusion is made of a material identical to a material of the edge cover film.

3. The display device according to claim 2, wherein
the first metal protrusion is disposed between the terminal section and one of sides of the display region, the one side facing the terminal section.

4. The display device according to claim 3, wherein
the second metal protrusion is disposed along a part of the one side of the display region facing the terminal section and along remaining three of the sides of the display region.

5. The display device according to claim 1, wherein
the first bank includes an island-shaped metal protrusion between the first and second metal protrusions, the island-shaped metal protrusion being disposed in a layer identical to a layer where the first and second metal protrusions are disposed.

6. The display device according to claim 1, wherein
a third interlayer insulating film is disposed between the third and fourth metal layers, and
the third interlayer insulating film has an opening under which the first power-source trunk wire and the first metal protrusion are in contact with each other and under which the second power-source trunk wire and the second metal protrusion are in contact with each other.

7. The display device according to claim 6, wherein
the conductive film and the second power-source trunk wire are in contact with each other at a portion where the first slit and the opening of the third interlayer insulating film overlap each other.

8. The display device according to claim 7, wherein
in a region where the first and second power-source trunk wires are adjacent to each other, a gap between the first and second power-source trunk wires under an edge of the first flattening film is wider than a gap between the first and second power-source trunk wires under the first bank.

9. The display device according to claim 1, wherein
a third interlayer insulating film is disposed between the first flattening film and the fourth metal layer, and
in the first slit, the first and second power-source trunk wires are covered with the third interlayer insulating film.

10. The display device according to claim 9, wherein
the conductive film and the second power-source trunk wire are electrically connected together via the second metal protrusion.

11. The display device according to claim 1, wherein
the scan signal line is included in the first metal layer,
a capacitive electrode serving as an electrode of the capacitor is included in the second metal layer,
the data signal line is included in the third metal layer, and
the power-source voltage line is included in the fourth metal layer.

12. The display device according to claim 1, wherein
a second bank having a frame shape is provided so as to surround the first bank,
a second slit in which the first and second flattening films and the edge cover film are removed is disposed between the first and second banks,
the first and second power-source trunk wires overlap the second slit,
the fourth metal layer includes
a third metal protrusion being in contact with the first power-source trunk wire, and
a fourth metal protrusion being in contact with the second power-source trunk wire, and
the second bank includes
the third metal protrusion,
the fourth metal protrusion, and
a second resin protrusion overlapping the third and fourth metal protrusions, the second resin protrusion being disposed in a higher layer than the first electrode, the second resin protrusion having a frame shape.

* * * * *